United States Patent
Itaya et al.

(10) Patent No.: US 8,742,882 B2
(45) Date of Patent: Jun. 3, 2014

(54) TOUCH PANEL

(75) Inventors: Hisao Itaya, Shiga (JP); Shinya Nishihara, Kyoto (JP); Satoru Nakagawa, Kyoto (JP)

(73) Assignee: Gunze Limited, Kyoto (JP)

( * ) Notice: Subject to any disclaimer, the term of this patent is extended or adjusted under 35 U.S.C. 154(b) by 0 days.

(21) Appl. No.: 13/701,791

(22) PCT Filed: Jun. 1, 2011

(86) PCT No.: PCT/JP2011/063094
§ 371 (c)(1),
(2), (4) Date: Feb. 1, 2013

(87) PCT Pub. No.: WO2011/152560
PCT Pub. Date: Dec. 8, 2011

(65) Prior Publication Data
US 2013/0285788 A1   Oct. 31, 2013

(30) Foreign Application Priority Data
Jun. 4, 2010   (JP) .................................. 2010-128605

(51) Int. Cl.
*H01C 10/10*   (2006.01)
(52) U.S. Cl.
USPC .......................................... 338/47; 345/173
(58) Field of Classification Search
USPC ............................................................ 338/47
See application file for complete search history.

(56) References Cited

U.S. PATENT DOCUMENTS

| | | | |
|---|---|---|---|
| 4,293,734 A | 10/1981 | Pepper, Jr. | |
| 4,822,957 A * | 4/1989 | Talmage et al. ............ | 178/18.05 |
| 5,041,701 A * | 8/1991 | Wolfe et al. ................ | 178/18.05 |
| 5,045,644 A * | 9/1991 | Dunthorn .................... | 178/18.05 |
| 2003/0231169 A1 | 12/2003 | Aroyan et al. | |
| 2006/0181516 A1 | 8/2006 | Staines | |

FOREIGN PATENT DOCUMENTS

| | | |
|---|---|---|
| JP | 56-500230 A | 2/1981 |
| JP | 04-137026 A | 5/1992 |
| JP | 2001-125724 A | 5/2001 |
| JP | 2005-523531 A | 8/2005 |
| JP | 2006-221635 A | 8/2006 |
| WO | 80/01762 A1 | 9/1980 |
| WO | 03/090156 A2 | 10/2003 |

OTHER PUBLICATIONS

Machine translation of JP 2001-125724, Iizuka et al., published May 11, 2001.*
International Search Report; PCT/JP2011/063094; Oct. 25, 2011.

* cited by examiner

*Primary Examiner* — Kyung Lee
(74) *Attorney, Agent, or Firm* — Studebaker & Brackett PC

(57) ABSTRACT

The invention provides a touch panel capable of effectively preventing a distortion of an electric potential distribution, thereby increasing an input region of the touch panel. A touch panel including a resistive layer formed on one of surfaces of a substrate and a frame-shaped electrode portion 21 provided along four sides of the resistive layer, wherein each side of the frame-shaped electrode portion 21 is constituted in a broken line pattern having a first split electrode 25a disposed on both ends respectively and a plurality of second split electrodes 25b disposed between the first split electrodes 25a, second resistance values R_i between the second split electrodes 25b are set to be equal to each other, and a first resistance value R_s between the first split electrode 25a and the second split electrode 25b which is adjacent to the first split electrode 25a is different from the second resistance value R_i.

8 Claims, 10 Drawing Sheets

TOUCH PANEL

TECHNICAL FIELD

The present invention relates to a touch panel.

BACKGROUND ART

Conventionally, a structure of a touch panel for detecting an input position has been investigated variously, and a resistive type, an electrostatic capacitance type, a surface acoustic wave type, an infrared type, and the like are used. Some resistive types are referred to as a 4-wire type or a 5-wire type.

The 5-wire type touch panel includes transparent and rectangular resistive layers provided on opposed surfaces of two substrates, and a frame-shaped electrode formed along four sides of one of the resistive layers. Each of the sides of the frame-shaped electrode constitutes first and second electrode portions, which are opposed to each other, and third and fourth electrode portions, which are opposed to each other. Moreover, a run-around circuit for a connection to an external driving circuit is provided around the substrate.

Description will be given to a method of detecting a touch position in the touch panel having such a structure. First of all, a + (plus) voltage is applied to both ends of the first electrode portion and a − (minus) voltage is applied to both ends of the second electrode portion to form an electric potential gradient between the first electrode portion and the second electrode portion. Next, switching is carried out to apply a voltage between the third electrode portion and the fourth electrode portion, thereby forming an electric potential gradient in the same manner as described above. When the two electric potential gradients are changed over in a short time by means of a switch to repetitively perform the operation, an electric potential gradient is alternately formed on the substrate in horizontal and vertical directions. When one of the substrates is pressed (touched), the resistive layers come in contact with each other so that one of the substrates can measure an electric potential formed on the other substrate. By detecting the electric potential at that time, it is possible to obtain a touch position.

In the above touch panel, each electrode portion is generally caused to have a proper resistance in order to prevent an increase in a current flowing into a panel in application of a voltage. When the voltage is applied to the panel, consequently, a distortion of an electric potential distribution is caused by a voltage drop due to a resistance of the electrode portion. A degree of the distortion of the electric potential distribution is increased in the vicinity of each electrode portion. Therefore, as shown in FIG. 14, there is a problem in that a frame-shaped area 101 which is provided on an inside of the panel of each electrode portion 100 adjacently to the electrode portion 100 is hard to be used as a touch input portion, resulting in a decrease in an input region 102 of the touch panel.

Moreover, it is proposed that a plurality of T-shaped split electrodes 110 are disposed to constitute an electrode 111 as shown in FIG. 15 in order to reduce the degree of the distortion of the electric potential distribution (see Patent Document 1). In the above touch panel, however, the T-shaped portion of the split electrode is disposed to be protruded toward the inside of the panel. Therefore, it is hard to use, as a touch input portion, a region in which the T-shaped portion is to be disposed. As a result, a frame-shaped area adjacent to the electrode 111 cannot be used as the touch input portion, and consequently, the input region of the touch panel is decreased.

PRIOR ART DOCUMENT

Patent Document

Patent Document 1: Japanese Unexamined Patent Publication No. 4-137026

SUMMARY OF THE INVENTION

Problems to be Solved by the Invention

An object of the present invention is to provide a touch panel capable of effectively preventing a distortion of an electric potential distribution, thereby increasing an input region of the touch panel.

Means for Solving the Problems

The object of the present invention is achieved by a touch panel including a resistive layer formed on one of surfaces of a substrate and a frame-shaped electrode portion provided along four sides of the resistive layer, wherein each side of the frame-shaped electrode portion is constituted in a broken line pattern having a first split electrode disposed on both ends respectively and a plurality of second split electrodes disposed between the first split electrodes, second resistance values between the second split electrodes are set to be equal to each other, and a first resistance value between the first split electrode and the second split electrode which is adjacent to the first split electrode is different from the second resistance value.

Moreover, in the above touch panel, a frame-shaped non-touch area which is adjacent to the frame-shaped electrode portion and a touch area disposed on an inside of the non-touch area are preferably provided at an inside of a region surrounded by the frame-shaped electrode portion, and L, L_bow, R_s, R_i and N should satisfy a relationship of the following Formula 2:

$$R\_i \times N / [R\_i \times (N-1) + 2 \times R\_s] \leq (L - 2 \times L\_\text{bow})/L \quad \text{[Formula 2]}$$

wherein a distance between two sides which are opposed to each other in the frame-shaped electrode portion is represented by L (mm), a distance between each of the two sides and each boundary of a non-touch area which is adjacent to the two sides respectively and the touch area in the non-touch area is represented by L_bow (mm), each of the first resistance values in two other sides to be connected to the two sides is represented by R_s (Ω), each of the second resistance values in the two other sides is represented by R_i (Ω), and the number of the second split electrodes in the two other sides is represented by N.

Furthermore, the touch panel preferably further includes a plurality of electric potential correcting electrode portions connected to the respective sides of the frame-shaped electrode portion and extended toward an inside of the substrate from the frame-shaped electrode portion, and the electric potential correcting electrode portions to be connected to the respective sides of the frame-shaped electrode portion should be formed in such a manner that a segment connecting respective tip portions draws a curved line taking a convex shape toward the inside of the substrate in a central part.

In addition, the touch panel preferably further includes a frame-shaped inner electrode portion disposed on the inside of the region surrounded by the frame-shaped electrode portion and having each side which is almost parallel with the side of the frame-shaped electrode portion, and a sheet resistance converted value of a resistance value between both ends of the side of the inner electrode portion being set to be smaller than a sheet resistance value of the resistive layer.

Moreover, the inner electrode portion is preferably formed in a broken line pattern.

Furthermore, a pitch of the broken line pattern of the inner electrode portion is preferably set to be smaller than a pitch of the broken line pattern of the frame-shaped electrode portion.

In addition, the touch panel preferably further includes a current circuit for an inner electrode portion connecting a corner part of the frame-shaped electrode portion to a corner part of the inner electrode portion.

Moreover, the sheet resistance converted value of the resistance value between the both ends of the side of the inner electrode portion is preferably 1/5 to 1/50 of the sheet resistance value of the resistive layer.

Effects of the Invention

According to the present invention, it is possible to provide a touch panel capable of effectively preventing a distortion of an electric potential distribution, thereby increasing an input region of the touch panel.

EMBODIMENTS OF THE INVENTION

Figure 1:
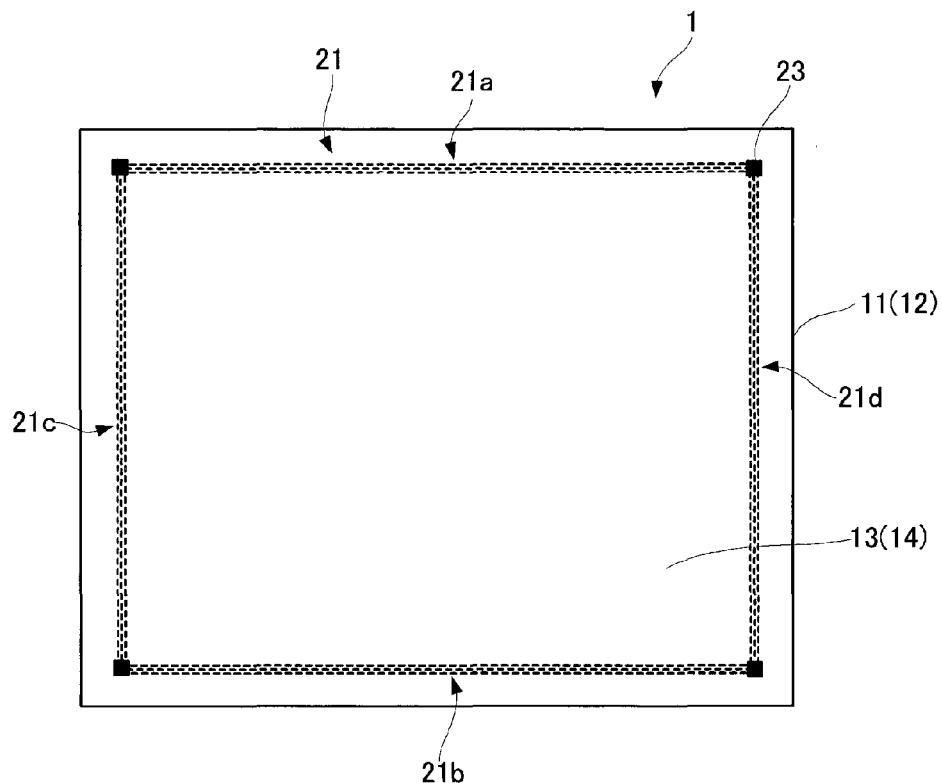
FIG. 1 is a plan view showing a schematic structure of a touch panel according to an embodiment of the present invention.
Figure 2:
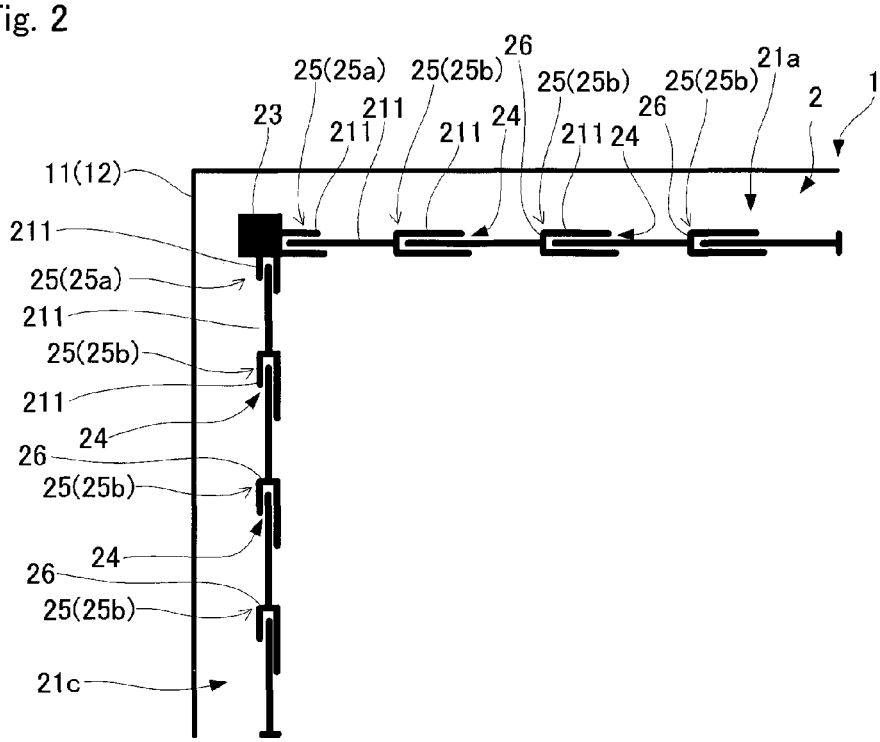
FIG. 2 is an enlarged plan view showing a main part of the touch panel illustrated in FIG. 1.
Figure 3:
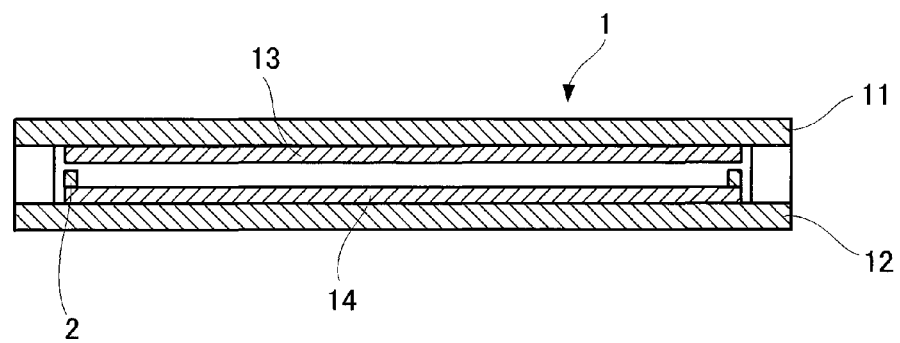
FIG. 3 is a sectional view showing the schematic structure of the touch panel illustrated in FIG. 1.

An embodiment of the present invention will be described below with reference to the accompanying drawings. For easy understanding of a structure, each of the drawings is not shown in an actual size ratio but is partially enlarged or reduced. FIG. 1 is a plan view showing a schematic structure of a touch panel 1 according to an embodiment of the present invention, and FIG. 2 is an enlarged plan view showing a main part of FIG. 1. FIG. 3 is a sectional view showing a schematic structure of the touch panel illustrated in FIG. 1.

As shown in FIGS. 1 to 3, the touch panel 1 is of a resistive type, and two substrates 11 and 12 are opposed to each other at a certain interval and rectangular and transparent resistive layers 13 and 14 are formed on opposed surfaces of the respective substrates 11 and 12. A plurality of spacers (not shown) are provided between the substrates 11 and 12. When the substrate 11 is flexed by being pressed by a finger or the like, the resistive layers 13 and 14 of both of the substrates 11 and 12 come in contact with each other.

It is preferable that at least the substrate 11 has flexibility and be formed by a material having high transparency. More specifically, examples of the material can include a flexible film such as polyethylene terephthalate (PET), polyimide (PI), polyethylene naphthalate (PEN), polyether sulfone (PES), polyether ether ketone (PEEK), polycarbonate (PC), polypropylene (PP), polyamide (PA), polyacryl (PAC), acryl, an amorphous polyolefin-based resin, a cyclic polyolefin-based resin, aliphatic cyclic polyolefin, or a norbornane-based thermoplastic transparent resin, a laminated product formed by at least two of them, glass, and the like.

For materials of the resistive layers 13 and 14, examples can include transparent conductive material such as indium tin oxide (ITO), indium oxide, antimony-doped tin oxide, fluorine-doped tin oxide, aluminum-doped zinc oxide, potassium-doped zinc oxide, silicon-doped zinc oxide, a zinc oxide-tin oxide-based material, an indium oxide-tin oxide-based material, a zinc oxide-indium oxide-magnesium oxide-based material, zinc oxide, or a tin oxide, a metallic material such as tin, copper, aluminum, nickel or chromium, and a metal oxide material. At least two of them may be used as a compound. Moreover, it is also possible to use, as a material, a metallic element which is not resistant to acid or alkali. Examples of a method of forming the resistive layers 13 and 14 can include a PVD process such as a sputtering process, a vacuum evaporation process or an ion plating process, a CVD process, a coating process, a printing process, and the like. Sheet resistance values of the resistive layers 13 and 14 are preferably 200 to 5 Ω/(ohm/square), and are further preferably 400 to 2 kΩ/. If the sheet resistance value is excessively small, there is a possibility that the resistive layers may be apt to be influenced by a resistance of a surrounding electrode, resulting in an increase in a distortion of an electric potential distribution. On the other hand, when the sheet resistance value is excessively great, there is a possibility that a necessity for reducing a thickness of the resistive layer may be generated in respect of mounting, resulting in a damage of stability of the resistive layer.

Moreover, it is also possible to use, as the materials of the resistive layers 13 and 14, a composite material obtained by dispersing, in a non-conductive polymer material, an extra fine conductive carbon fiber, for example, a carbon nanotube, a carbon nanohorn, a carbon nanowire, a carbon nanofiber, or a graphite fibril, or an extra fine metal fiber, for example, a silver nanowire, or a conductive polymeric material.

Furthermore, the touch panel 1 according to the present invention includes a frame-shaped electrode portion 21 formed along four sides of the resistive layer 14. In order to increase usable areas of the resistive layers 13 and 14, the frame-shaped electrode portion 21 is provided in a position which is as close as possible around the resistive layers 13 and 14. Although not shown in FIGS. 1 to 3, a run-around circuit for a connection to an external driving circuit is provided around the substrates 11 and 12.

The frame-shaped electrode portion 21 can be formed by coating a conductive paste such as a silver paste by a printing process such as screen printing, ink jet printing, or photolithography.

As shown in FIGS. 1 and 3, a voltage is applied to each side of the frame-shaped electrode portion 21 through a feeding terminal 23 attached to four corners of the resistive layer 14. The respective sides of the frame-shaped electrode portion 21 constitute an upper side electrode portion 21a and a lower side electrode portion 21b, which are opposed to each other, and a left side electrode portion 21c and a right side electrode portion 21d, which are opposed to each other. The upper side electrode portion 21a, the lower side electrode portion 21b, the left side electrode portion 21c, and the right side electrode portion 21d are constituted in such a manner that respective terminal based resistance values (resistance values between the feeding terminals 23) range from 30Ω to 250Ω. The respective electrode portions 21a, 21b, 21c, and 21d are constituted in such a manner that the terminal based resistance values preferably range from 50Ω to 150Ω, and further preferably range from 70Ω to 120Ω.

Moreover, each side of the frame-shaped electrode portion 21 is formed in a broken line pattern divided into a plurality of parts through a plurality of gaps 24 as illustrated in the enlarged view showing a main part in FIG. 2. A plurality of split electrodes 25 divided by the gaps 24 are arranged linearly along the sides of the resistive layers 13 and 14, and the split electrodes 25 provided on both ends are connected to the feeding terminal 23.

The gap 24 is provided on each of the sides of the frame-shaped electrode portion 21 in order to cause each side of the frame-shaped electrode portion 21 to have a proper resistance. For example, in the case in which the resistive layers 13 and 14 are set to be ITO and each side of the frame-shaped electrode portion 21 is formed by a silver paste, the resistance of each side of the frame-shaped electrode portion 21 is excessively reduced as compared with the resistive layers 13 and 14 if there is no gap 24. Consequently, a current is apt to flow to each side of the frame-shaped electrode portion 21 when a voltage is applied to the panel. Furthermore, when the resistance of each side is excessively high, a distortion is increased so that precision in detection is deteriorated. In order to prevent the situation, each side of the frame-shaped electrode portion 21 is caused to have the proper resistance by the gap 24.

FIG. 2 shows a specific example of the split electrode 25. Each side of the frame-shaped electrode portion 21 is constituted by two types of split electrodes 25a and 25b having different shapes from each other. One of the split electrodes (the first split electrode 25a) is disposed on both ends of each side of the frame-shaped electrode portion 21, and is constituted by two conductive wires 211 which are provided in parallel with each other at a predetermined interval. One of ends of the conductive wire 211 is connected to the feeding terminal 23. Each conductive wire 211 is constituted in such a manner that a direction along each side of the frame-shaped electrode portion 21 is set to be a longitudinal direction.

The other split electrodes (the second split electrodes 25b) are disposed between the first split electrodes 25a provided on both ends of each side of the frame-shaped electrode portion 21 respectively, and includes three conductive wires 211 disposed in parallel with each other at a predetermined interval and a coupling conductive portion 26. Each of the conductive wires 211 is constituted in such a manner that the direction along each side of the frame-shaped electrode portion 21 is set to be the longitudinal direction. The coupling conductive portion 26 is extended in an orthogonal direction to the three conductive wires 211 and is connected to ends of the three conductive wires 211. Although each of the three conductive wires 211 is extended with the coupling conductive portion 26 set as a starting point, the central conductive wire 211 of the three conductive wires 211 is extended in a different direction (on an opposite side) to the two other conductive wires 211. Furthermore, a part of the central conductive wire 211 is disposed in a region interposed between the two other conductive wires 211 of the adjacent split electrode 25. The number of the conductive wires 211 constituting the first split electrode 25a and the second split electrode 25b is not restricted to the number described above, but one or two conductive wires 211 may be used, or at least three conductive wires 211 may be used.

Figure 4:
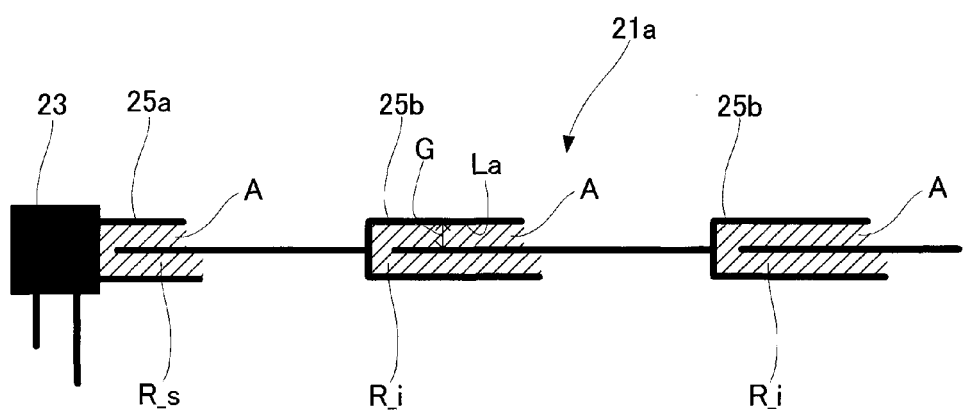
FIG. 4 is an explanatory view for describing a resistance generated between split electrodes.

A resistance generated in the gap 24 will be described with reference to FIG. 4. A region indicated by A in which the split electrodes 25 are opposed to each other is operated as a resistor in the gap 24. When sheet resistances of the resistive layers 13 and 14 are represented by Rst, a width of the gap 24 is represented by G, and a length of a portion in which the split electrodes 25 are opposed to each other is represented by La, a resistance Rg generated in the gap 24 is expressed in an equation Rg=Rst×G/La. In accordance with this equation, it is apparent that the resistance Rg generated in the gap 24 is determined by the sheet resistances of the resistive layers 13 and 14 and the shape of the gap 24. Since the sheet resistances of the resistive layers 13 and 14 are predefined, the resistance Rg can be regulated by the width G of the gap or the length La.

In the present embodiment, referring to a value of each resistance generated between the gaps 24, each resistance value (a first resistance value) between the first split electrode 25a and the second split electrode 25b which is adjacent to the first split electrode 25a is set to be different from each resistance value (a second resistance value) between the second split electrodes 25b. Moreover, the resistance values (the second resistance values) between the second split electrodes 25b are set to be uniform, respectively.

Figure 14:
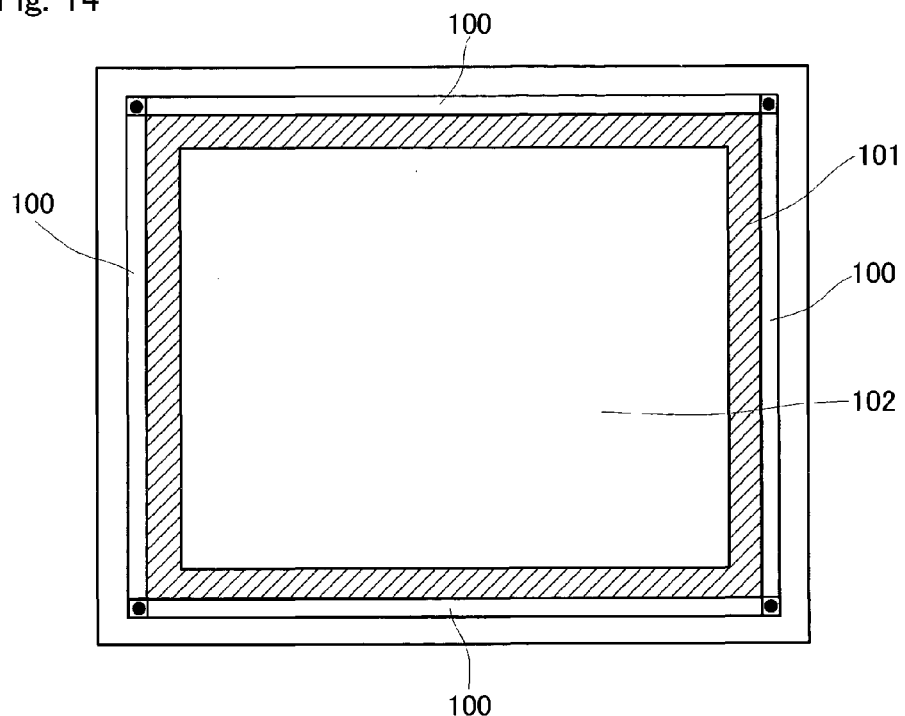
FIG. 14 is an explanatory view for describing a drawback in a conventional touch panel.

By setting the first resistance value and the second resistance value, thus, it is possible to reduce the degree of the distortion of the electric potential distribution in the vicinity of the frame-shaped electrode portion 21 which is caused by the voltage drop due to the resistance in the frame-shaped electrode portion 21. Consequently, it is possible to decrease an area of a frame-shaped non-touch area (an area indicated by 101 in FIG. 14) which is set adjacently to the frame-shaped electrode portion 21 at an inside of a region surrounded by the frame-shaped electrode portion 21, thereby increasing an area of a touch area (an area indicated by 102 in FIG. 14).

Figure 5:
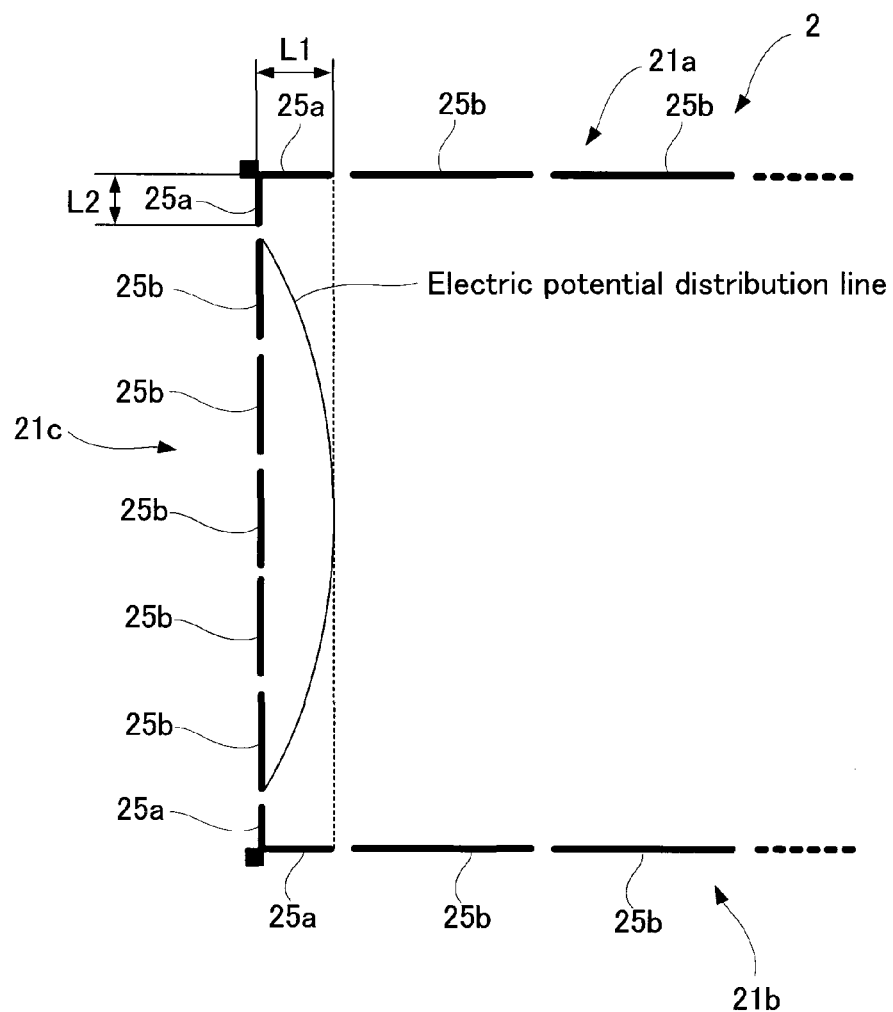
FIG. 5 is an explanatory view for describing a method of setting a length of a first split electrode.

Furthermore, it is preferable that a length L1 of the first split electrode 25a be set in as follows. That is, as shown in FIG. 5, it is preferable that the length of the first split electrode 25a in the upper side electrode portion 21a (or the lower side electrode portion 21b) be set to be almost equal to a distance between an apex in a curved line-shaped electric potential distribution line passing through both ends of the electrode portion constituted by the second split electrodes 25b in the left side electrode portion 21c (or the right side electrode portion 21d) and the left side electrode portion 21c (or the right side electrode portion 21d). Similarly, it is preferable that a length L2 of the first split electrode 25a in the left side electrode portion 21c (or the right side electrode portion 21d) be set to be almost equal to a distance between an apex in a curved line-shaped electric potential distribution line passing through both ends of the electrode portion constituted by the second split electrodes 25b in the upper side electrode portion 21a (or the lower side electrode portion 21b) and the upper side electrode portion 21a (or the lower side electrode portion 21b).

Figure 6:
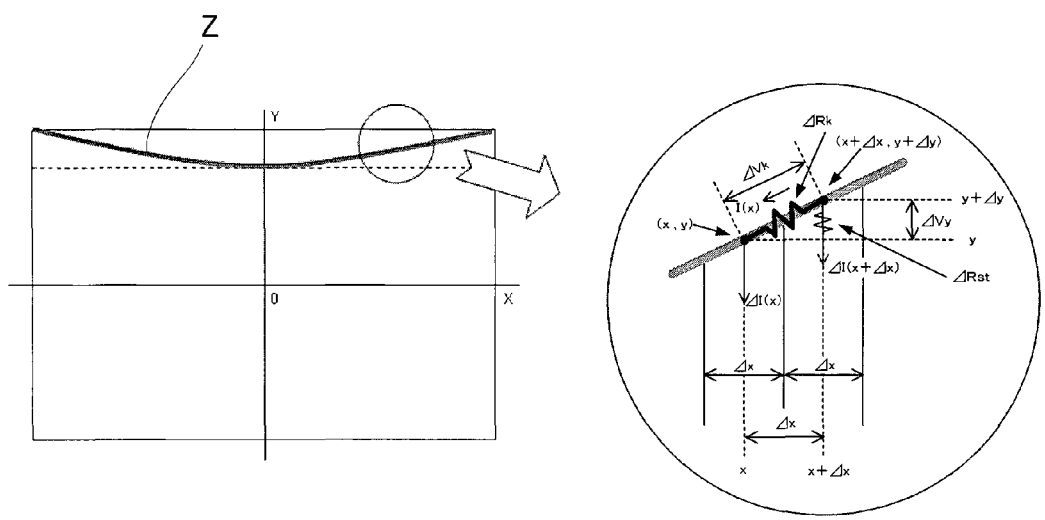
FIG. 6 is a model diagram for calculating an equation for setting the length of the first split electrode.

For example, the length L1 (L2) of the first split electrode 25a may be determined in accordance with the following [Formula 1]. A method of deriving the [Formula 1] will be described below. First of all, as shown in a left side chart of FIG. 6, there is assumed a model in which a curved electrode (a resistance line) Z is disposed in the touch panel 1 having a width 2X and a length 2Y. An origin of a coordinate axis is set to be a middle point of the touch panel 1. FIG. 6 is a schematic diagram for deriving a shape of the resistance wire on the assumption that "if a horizontal electric potential distribution line is formed under the curved electrode (the resistance line) Z", and a part thereof is shown in a circle of a right side view. Moreover, an ITO surface is assumed to be a set of rectangular columns which have a width $\Delta x$ as thin as possible, and a terminal based resistance value of the curved electrode Z is represented by Rk, and a resistor is regarded to be disposed rectilinearly ($\Delta Rk=(Rk/(2 \cdot X))$).

A current $\Delta I(x)$ flowing through each rectangular column of ITO having the width $\Delta x$ will be taken into consideration. It is assumed that the horizontal electric potential distribution line is formed under the curved electrode (resistance line Z). Therefore, the assumption is not established if a difference is made between a current $\Delta I(x)$ flowing through the ITO rectangle in an x position and $\Delta I(x+\Delta x)$ which is provided apart by $\Delta x$. Accordingly, $\Delta I(x)=\Delta I(x+\Delta x)$ is obtained and a current flowing through each rectangle is represented by $\Delta I$ (a constant).

A current flowing from coordinates $(x+\Delta x, y+\Delta y)$ to coordinates $(x, y)$ over the curved electrode (resistance line) Z is obtained as $I(x)=x \sim \Delta I$ because x represents a sum of currents from 1 to x. Moreover, a resistance value from coordinates $(x+\Delta x, y+\Delta y)$ to coordinates $(x+\Delta x, y)$ in the ITO rectangle is obtained as $\Delta Rst=Rst \cdot (\Delta y/\Delta x)$.

Accordingly, voltage drops $\Delta Vk$ and $\Delta Vs$ of $\Delta Rk$ and $\Delta Rst$ are obtained as:

$$\Delta Vk=\Delta Rk \cdot I(x)=(Rk/(2 \cdot X)) \cdot x \cdot \Delta I$$

$$\Delta Vst=\Delta Rst \cdot \Delta I=Rst \cdot (\Delta y/\Delta x) \cdot \Delta I.$$

Based on $\Delta Vk=\Delta Vst$, $$(Rk/(2 \cdot X)) \cdot x=Rst \cdot (\Delta y/\Delta x)$$

$$\Rightarrow \Delta y=(Rk/(2 \cdot Rst \cdot X)) \cdot x \cdot \Delta x$$

a micro unit is regarded to be continuous from a discrete value, and consequently, $$dy=(Rk/(2 \cdot Rst \cdot X)) \cdot x \cdot dx \text{ is obtained.}$$

Through an integral of both sides, there is obtained $$y=(Rk/(4 \cdot Rst \cdot X)) \cdot x^2+C.$$

Based on y=Y with x=X, there is obtained $$C=Y-(Rk/Rst) \cdot X/4.$$

As a result, there is obtained $$y=(Rk/(4 \cdot Rst \cdot X)) \cdot x^2+Y-(Rk/Rst) \cdot X/4 \quad \text{[Formula 1]}.$$

In the [Formula 1], it is possible to calculate the length L2 of the first split electrode 25a in the left side electrode portion 21c (or the right side electrode portion 21d) by setting Rk to be the resistance value between both ends of the electrode portion constituted by the second split electrodes 25b in the upper side electrode portion 21a (or the lower side electrode portion 21b), Rst to be the sheet resistance value of the resistive layer 13 (14) and x=0. Similarly, it is possible to calculate the length L1 of the first split electrode 25a in the upper side electrode portion 21a (or the lower side electrode portion 21c) by setting Rk to be the resistance value between the both ends of the electrode portion constituted by the second split electrodes 25b in the left side electrode portion 21c (or the right side electrode portion 21d), Rst to be the sheet resistance value of the resistive layer 13(14) and x=0.

Thus, by setting the length of each of the first split electrodes 25a, it is possible to further reduce the degree of the distortion of the electric potential distribution caused by the voltage drop due to the resistance of the frame-shaped electrode portion 21 in the vicinity of the frame-shaped electrode portion 21, thereby further increasing the area of the touch area.

Moreover, by setting the first resistance value and the second resistance value as described above, it is possible to obtain the following Formula 2. By using the Formula 2, it becomes easy to design a touch panel for decreasing an area of a non-touch area and increasing an area of a touch area.

$$R\_i \times /[R\_i \times (N-1)+2 \times R\_s] \leq (L-2 \times L\_\text{bow})/L \quad \text{[Formula 2]}$$

Figure 7:
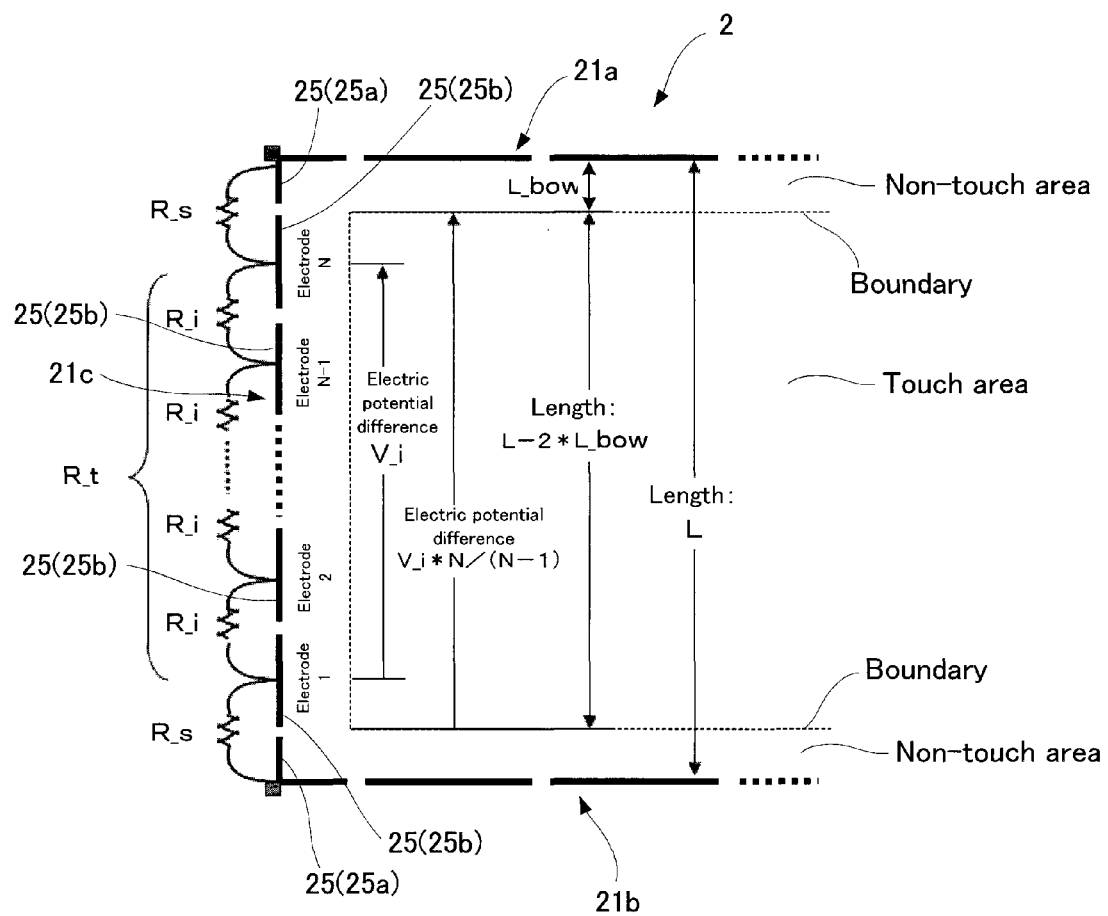
FIG. 7 is a schematic diagram representing a frame-shaped electrode portion possessed by the touch panel illustrated in FIG. 1.

The respective parameters (L, L_bow, R_s, R_i, and N) in the Formula 2 will be described with reference to FIG. 7. L [mm] represents a distance between two sides which are opposed to each other in the frame-shaped electrode portion 21 in the case of setting a frame-shaped non-touch area provided adjacently to the frame-shaped electrode portion 21 and a touch input portion (a touch area) disposed on an inside of the non-touch area, and L_bow [mm] represents a distance between each of the two sides and each boundary between the non-touch area and the touch area in the non-touch area which is adjacent to the two sides respectively. Moreover, each first resistance value in two other sides connected to the two sides is represented by R_s [Ω], each second resistance value in the two other sides is represented by R_i [Ω], and the number of the second split electrodes 25b in the two other sides is represented by N.

A method of calculating the Formula 2 will be described below with reference to FIG. 7. FIG. 7 shows the case in which an equal voltage is applied to the upper side electrode portion 21a of the frame-shaped electrode portion 21. In the left side electrode portion 21c (or the right side electrode portion 21d), if N second split electrodes 25b are provided, (N−1) resistors are provided between the second split electrodes 25b. A resistance between the second split electrodes 25b is a uniform distribution resistance. If an electric potential difference between both ends of the distribution resistance is represented by V_i, an electric potential difference between electrodes is represented by V_i/(N−1). In a total width of the left side electrode portion 21c (or the right side electrode portion 21d), N second split electrodes 25b are provided. Therefore, an electric potential difference of V_i×N/(N−1) is obtained.

Next, a relational expression for a resistance value and a distance is derived as follows, wherein a distance between the upper side electrode portion 21a and the lower side electrode portion 21b which are opposed to each other in the frame-shaped electrode portion 21 is represented by L [mm] and a distance between the upper side electrode portion 21a (or the lower side electrode portion 21b) and each boundary of the non-touch area and the touch area is presented by L_bow [mm].

$$[R\_t \times N/(N-1)]/[R\_t+2 \times R\_s]=(L-2 \times L\_\text{bow})/L$$

In this relational expression, R_t represents a resistance value between both ends of the second split electrodes 25b arranged rectilinearly. If each resistance value (the second resistance value) of the resistors between the second split electrodes is represented by R_i[Ω], R_t=R_i×(N−1) is obtained. Therefore, referring to the left side electrode portion 21c (or the right side electrode portion 2c), there is derived a relational expression (Formula A) of:

$$R\_i \times N/[R\_i \times (N-1) + 2 \times R\_s] = (L - 2 \times L\_\text{bow})/L.$$

Referring to the upper side electrode portion 21a and the lower side electrode portion 21b, similarly, it is possible to derive the relational expression of the Formula A.

By setting the left side in the Formula A (R_i×N/[R_i×(N−1)+2×R_s]) to be equal to or smaller than the value of the right side ((L−2×L_bow)/L), that is, by properly setting R_s, R_i, and N to satisfy the relationship of the Formula 2, it is possible to decrease the area of the frame-shaped non-touch area (the area indicated by 101 in FIG. 14) which is set adjacently to the frame-shaped electrode portion 21 at the inside of the region surrounded by the frame-shaped electrode portion 21, thereby increasing the area of the touch area (the area indicated by 102 in FIG. 14) while reducing the degree of the distortion of the electric potential distribution which is caused by the voltage drop due to the resistance of the frame-shaped electrode portion 21.

A value of R_t to be the resistance value between the both ends of the second split electrodes 25b arranged rectilinearly can be determined from a value of L_bow in accordance with the [Formula 1]. Specific description will be given. In the [Formula 1], it is possible to calculate Rk by setting Rst to be the sheet resistance value of the resistive layer 13 (14), and x=0 and y=L_bow. Rk corresponds to the resistance value R_t between the both ends of the second split electrodes 25b arranged rectilinearly. Therefore, R_t can be determined. Subsequently, by optionally setting N (the number of the second split electrodes 25b), it is possible to calculate R_i, and to further determine R_s (the first resistance value) satisfying the [Formula 2].

In the touch panel 1 having the structure described above, the method of detecting a touch position is the same as that of the conventional touch panel. First of all, a + (plus) voltage is applied to both ends of the upper side electrode portion 21a and a − (minus) voltage is applied to both ends of the lower side electrode portion 21b to form an electric potential gradient between the upper side electrode portion 21a and the lower side electrode portion 21b. Next, switching is carried out to apply a voltage between the left side electrode portion 21c and the right side electrode portion 21d, thereby forming an electric potential gradient in the same manner as described above. When the two electric potential gradients are changed over in a short time by means of a switch (not shown) to repetitively perform the operation, an electric potential gradient is alternately formed on the substrate 12 in horizontal and vertical directions. When a predetermined position of the substrate 11 is pressed, the resistive layers 13 and 14 come in contact with each other so that the substrate 11 can measure an electric potential formed on the substrate 12. By detecting the electric potential at that time, it is possible to obtain a touch position.

Figure 8:
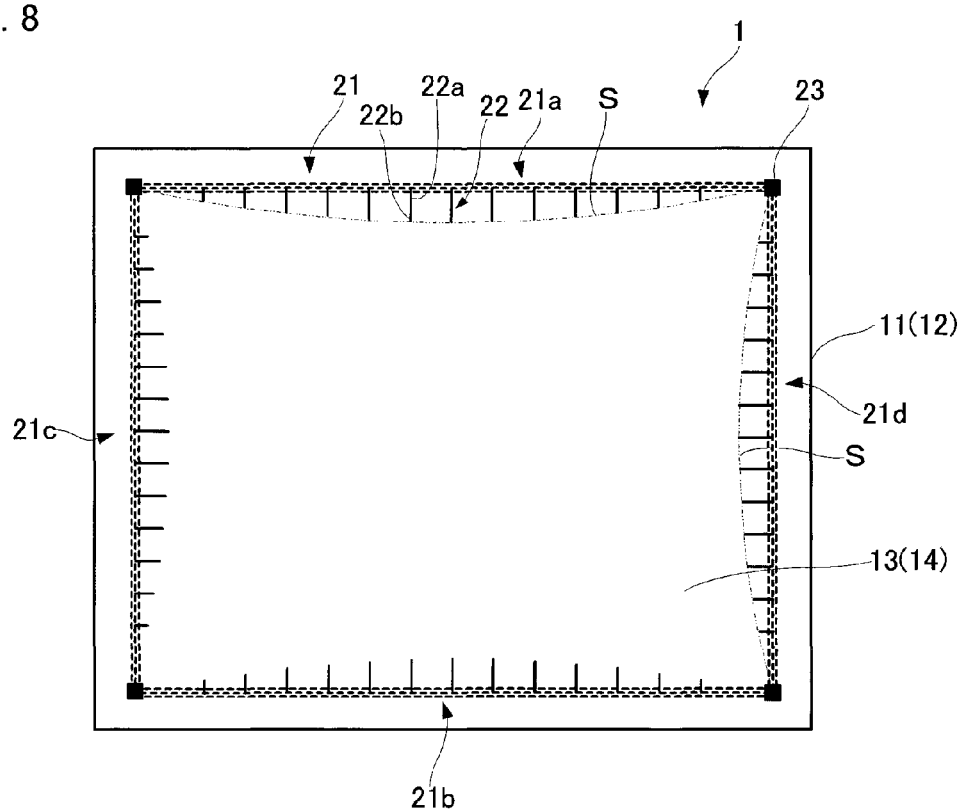
FIG. 8 is a plan view showing a schematic structure according to a variant of the touch panel illustrated in FIG. 1.

Although the embodiment of the touch panel 1 according to the present invention has been described above, the specific structure is not restricted to the above embodiment. For example, as shown in FIG. 8, it is also possible to have such a structure as to further include a plurality of electric potential correcting electrode portions 22 connected to the respective sides of the frame-shaped electrode portion 21 and extended toward the inside of the substrate 12 from the frame-shaped electrode portion 21. Each of the electric potential correcting electrode portions 22 has a structure in which a base end 22a is connected to each of the sides of the frame-shaped electrode portion 21 and a tip portion 22b is disposed on the inside of the substrate 12 from the frame-shaped electrode portion 21, and takes a rectilinear shape. Lengths of the electric potential correcting electrode portions 22 connected to the respective sides of the frame-shaped electrode portion 21 are set to be increased gradually from an end of the side of the frame-shaped electrode portion 21 toward a center of the side. Moreover, the electric potential correcting electrode portions 22 connected to the respective sides of the frame-shaped electrode portion 21 are formed in such a manner that a segment S connecting the tip portions 22b draws a curved line taking a convex shape toward the insides of the substrates 11 and 12 on the center of the side of the frame-shaped electrode portion 21.

A method of determining a position of the tip portion 22b in each of the electric potential correcting electrode portions 22 will be described below. In the case in which the electrode is constituted by only the frame-shaped electrode portion 21 (the case in which the electric potential correcting electrode portion 22 is not formed) as shown in FIG. 1, for example, the electric potential distribution line takes a curved shape in almost all region of the resistive layers 13 and 14 in application of a+(plus) voltage to the upper side electrode portion 21a and a−(minus) voltage to the lower side electrode portion 21b. It is preferable to constitute the electric potential correcting electrode portion 22 in such a manner that the tip portions 22b of the electric potential correcting electrode portions 22 to be provided on the upper side electrode portion 21a are disposed over a curved line of an electric potential distribution passing through both ends of the electrode portion formed by the second split electrodes 25b in the upper side electrode portion 21a.

In the same manner as the upper side electrode portion 21a, the electric potential correcting electrode portions 22 to be connected to the lower side electrode portion 21b are preferably constituted in such a manner that the tip portions 22b of the electric potential correcting electrode portions 22 to be provided on the lower side electrode portion 21b are disposed over the curved line of the electric potential distribution passing through both ends of the electrode portion formed by the second split electrodes 25b in the lower side electrode portion 21b.

Referring to the electric potential correcting electrode portion 22 to be connected to the left side electrode portion 21c and the right side electrode portion 21d, similarly, in the case in which the electrode is constituted only by the outer electrode portion 21 (the case in which the electric potential correcting electrode portion 22 is not formed), it is preferable to set the position of the tip portion 22b of the electric potential correcting electrode portion 22 based on a position of the electric potential distribution line taking a shape of a curved line passing through the both ends of the electrode portion formed by the second split electrodes 25b in the left side electrode portion 21c (or the right side electrode portion 21d) in the application of a+(plus) voltage to the left side electrode portion 21c and a−(minus) voltage to the right side electrode portion 21d.

Moreover, it is also possible to determine the position of the tip portion 22b of the electric potential correcting electrode portion 22 by using the [Formula 1], for example. In other words, in the [Formula 1], it is possible to calculate the position of the tip portion 22b of each electric potential correcting electrode portion 22 by setting Rk to be the resistance value between both ends of each side of the frame-shaped electrode portion 21 and Rst to be the sheet resistance value of the resistive layer 13 (14).

Accordingly, by providing the electric potential correcting electrode portion 22, it is possible to further reduce the degree of the distortion of the electric potential distribution caused by the voltage drop due to the resistance of the frame-shaped electrode portion 21.

Figure 15:
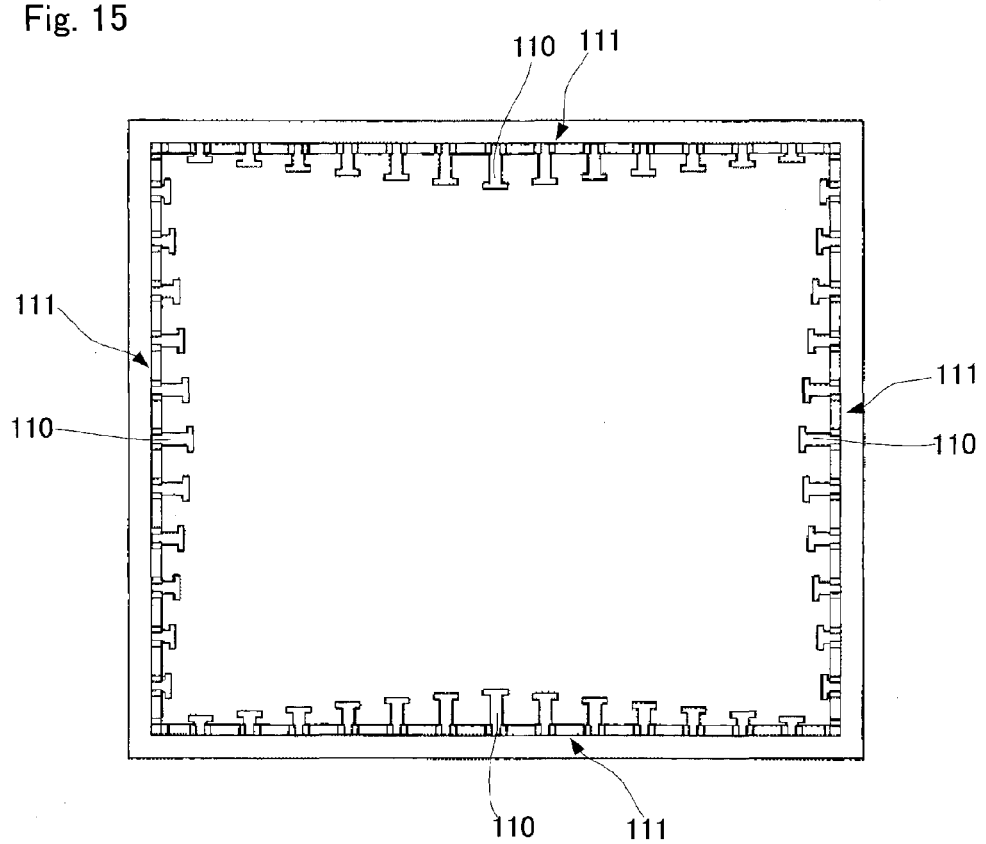
FIG. 15 is a plan view showing a schematic structure of the conventional touch panel.

Although the rectilinear shape is employed as the shape of each electric potential correcting electrode portion 22 in the touch panel shown in FIG. 8, it is also possible to employ a T shape described in FIG. 15 illustrating the conventional example, for example.

Figure 9:
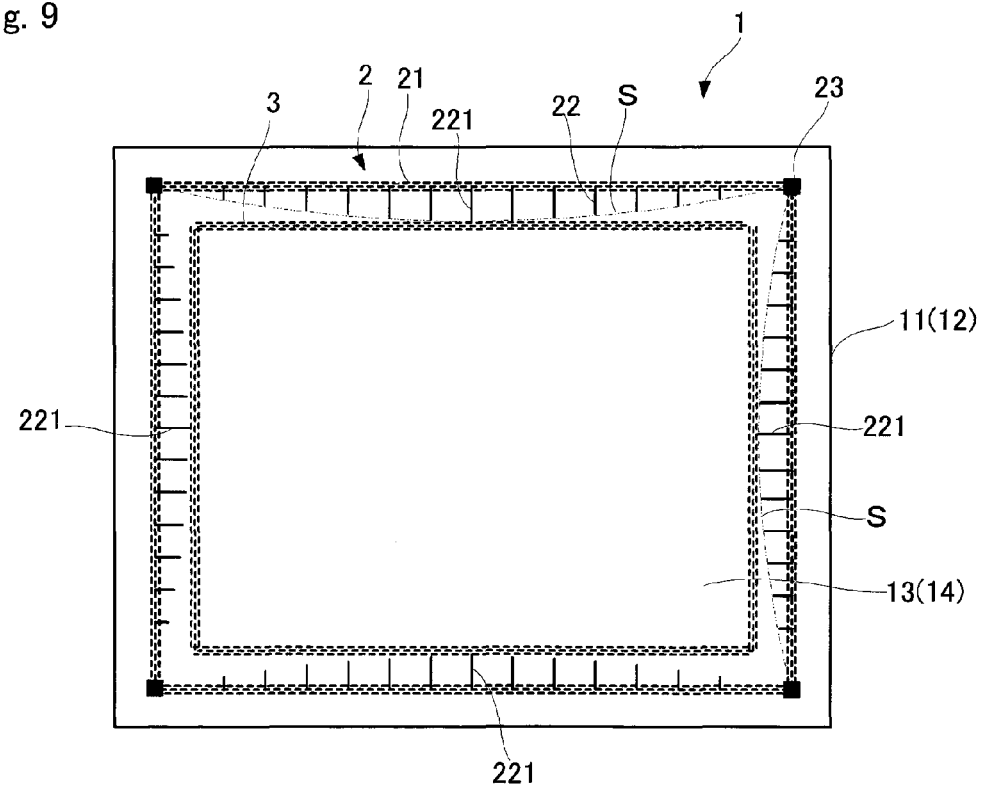
FIG. 9 is a plan view showing a schematic structure according to another variant of the touch panel illustrated in FIG. 1.

Moreover, as shown in FIG. 9, it is also possible to have such a structure as to further include a frame-shaped inner electrode portion 3 disposed on an inside of a region surrounded by the outer electrode portion 21 to which the electric potential correcting electrode portions 22 are connected and having each side which is almost parallel with each side of the frame-shaped electrode portion 21. The inner electrode portion 3 is formed in such a manner that a sheet resistance converted value of a resistance value between both ends of each side of the inner electrode portion 3 is smaller than the sheet resistance values of the resistive layers 13 and 14. The sheet resistance converted value of the resistance value between the both ends of each side of the inner electrode portion 3 indicates a value calculated in accordance with the following equation, wherein the resistance value between the both ends of each side of the inner electrode portion 3 is represented by $R\_in$, a length between the both ends of each side of the inner electrode portion 3 is represented by $L\_in$ and a width of each side of the inner electrode portion 3 is represented by $W\_in$.

$$R\_in \times W\_in / L\_in$$

The width $W\_in$ of each side of the inner electrode portion 3 implies a total width in which three conductive wires taking a shape of a broken line are disposed in parallel when the three conductive wires are provided in parallel to form each side of the inner electrode portion 3, for example.

The sheet resistance values of the resistive layers 13 and 14 are preferably 200 to 5 kΩ/ as described above and are further preferably 400 to 2 kΩ/. On the other hand, the sheet resistance converted value of the resistance value between the both ends of each side of the inner electrode portion 3 is preferably 1/5 to 1/50 of the sheet resistance values of the resistive layers 13 and 14 and is further preferably 1/10 to 1/30. If the sheet resistance converted value of the resistance value between the both ends of each side of the inner electrode portion 3 is excessively small, a current flowing between the both ends of each side of the inner electrode portion 3 is increased so that a drop in a voltage between both ends may be reduced. If the sheet resistance converted value of the resistance value between the both ends of each side of the inner electrode portion 3 is excessively great, the current hardly flows to each side of the inner electrode portion 3 so that the generation of the distortion of the electric potential distribution may not be prevented effectively.

Figure 10:
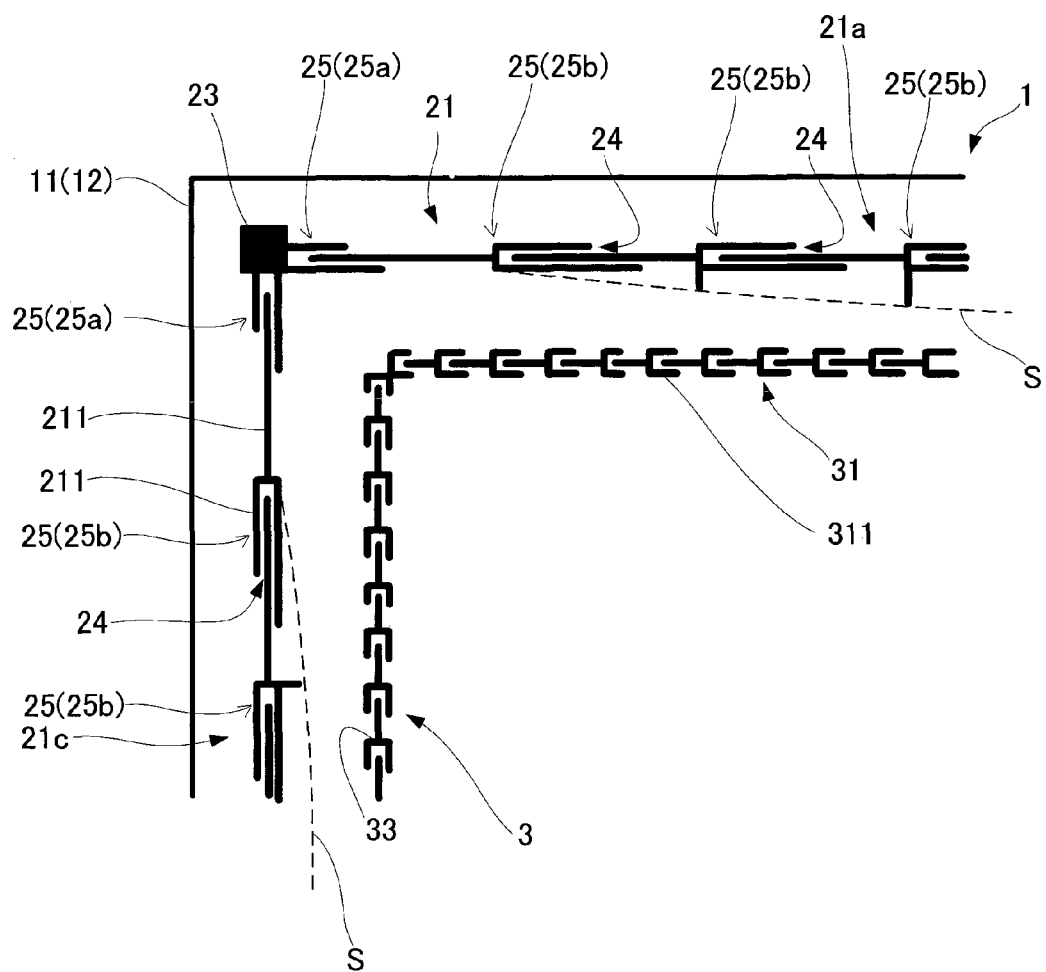
FIG. 10 is an enlarged plan view showing a main part of the touch panel illustrated in FIG. 9.

Moreover, as illustrated in an enlarged view showing a main part of FIG. 10, each side of the frame-shaped inner electrode portion 3 is formed in a broken line pattern divided into a plurality of parts through a plurality of gaps. A pitch of the broken line pattern of each side of the inner electrode portion 3 is set to be smaller than that of the broken line pattern of each side of the frame-shaped electrode portion 21. In other words, a length of a split electrode 31 in each side of the inner electrode portion 3 is set to be smaller than the lengths of the first split electrode 25a and the second split electrode 25b which constitute each side of the frame-shaped electrode portion 21. In FIG. 10, three conductive wires 311 formed in the broken line pattern are disposed in parallel to form each side of the inner electrode portion 3, and the respective conductive wires 311 are connected to each other through a coupling conductive portion 33 extended in a transverse direction of each side of the inner electrode portion 3. A plurality of coupling conductive portions 33 are disposed at a predetermined interval. Although the three conductive wires 311 formed in the broken line pattern are disposed in parallel to form each side of the inner electrode portion 3 in FIG. 10, the number of the conductive wires 311 formed in the broken line pattern is not restricted to the number described above, but may be one, two, or at least four.

The touch panel 1 having the structure described above includes the frame-shaped inner electrode portion 3 disposed on the inside of the region surrounded by the frame-shaped electrode portion 21 and the electric potential correcting electrode portion 22, and the resistance value between the both ends of each side of the inner electrode portion 3 is set to be smaller than the sheet resistance value of the resistive layer 14. For this reason, a current flows to the inner electrode portion 3. Therefore, even in the case in which a distortion (a small distortion) of an electric potential distribution occurs between the tip portions 22b of the electric potential correcting electrode portions 22, it is possible to relieve the distortion of the electric potential distribution, thereby forming horizontal and vertical electric potential distributions in a region surrounded by the frame-shaped inner electrode portion 3.

Moreover, since each side of the frame-shaped electrode portion 21 is formed in the broken line pattern and is constituted to include the gaps 24, the electric potential distribution fluctuates between the gaps 24 which are adjacent to each other. However, the pitch of the broken line pattern of each side of the inner electrode portion 3 is set to be smaller than that of the broken line pattern of each side of the frame-shaped electrode portion 21. Therefore, it is possible to carry out correction in such a manner that the fluctuation in electric potential distribution between the adjacent gaps 24 in the frame-shaped electrode portion 21 is varied slowly. As a result, the distortion of the electric potential distribution is relieved so that the horizontal and vertical electric potential distributions can be formed in the region surrounded by the frame-shaped inner electrode portion 3. Thus, it is possible to further enhance detecting performance of the touch panel.

Figure 11:
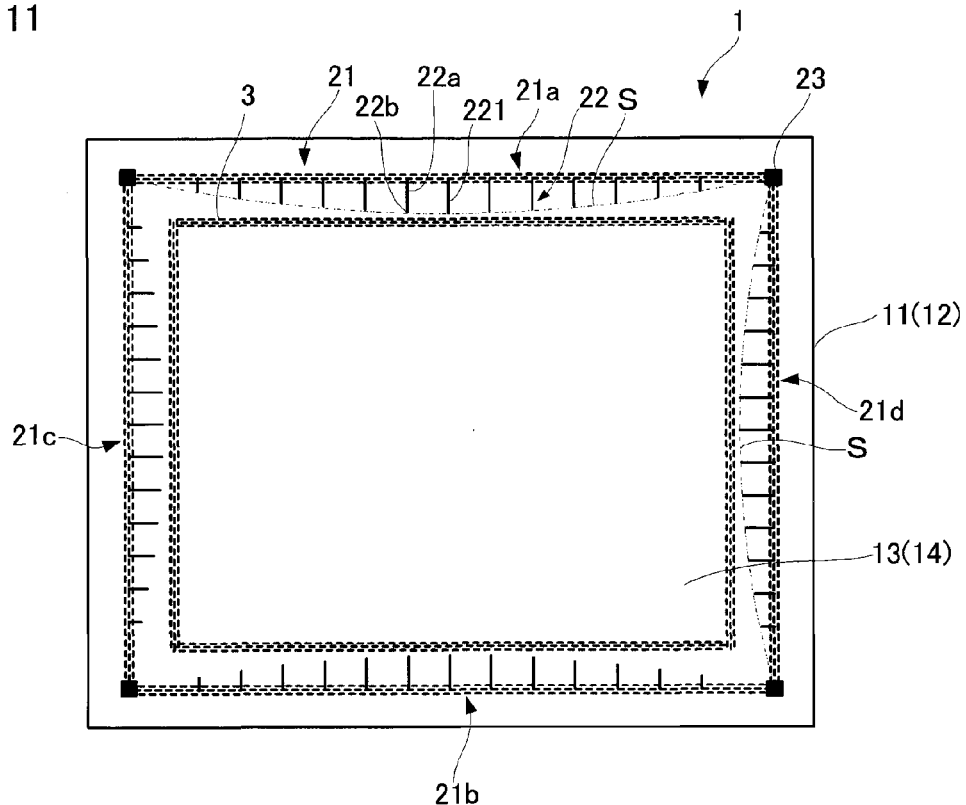
FIG. 11 is a plan view showing a schematic structure according to a variant of the touch panel illustrated in FIG. 1.

In FIG. 9, there is employed the structure in which a tip portion of an electric potential correcting electrode portion 221 to be connected to a center of each side of the frame-shaped electrode portion 21 is connected to each side of the inner electrode portion 3. However, for example, it is also possible to employ such a structure that each side of the inner electrode portion 3 is not connected to the tip portion of the electric potential correcting electrode portion 221 to be connected to the center of each side of the frame-shaped electrode portion 21 as shown in FIG. 11. With such a structure, similarly, it is possible to relieve the distortion (the small distortion) of the electric potential distribution which occurs between the tip portions 22b of the electric potential correcting electrode portions 22, thereby forming the horizontal and vertical electric potential distributions in the region surrounded by the frame-shaped inner electrode portion 3.

Figure 12:
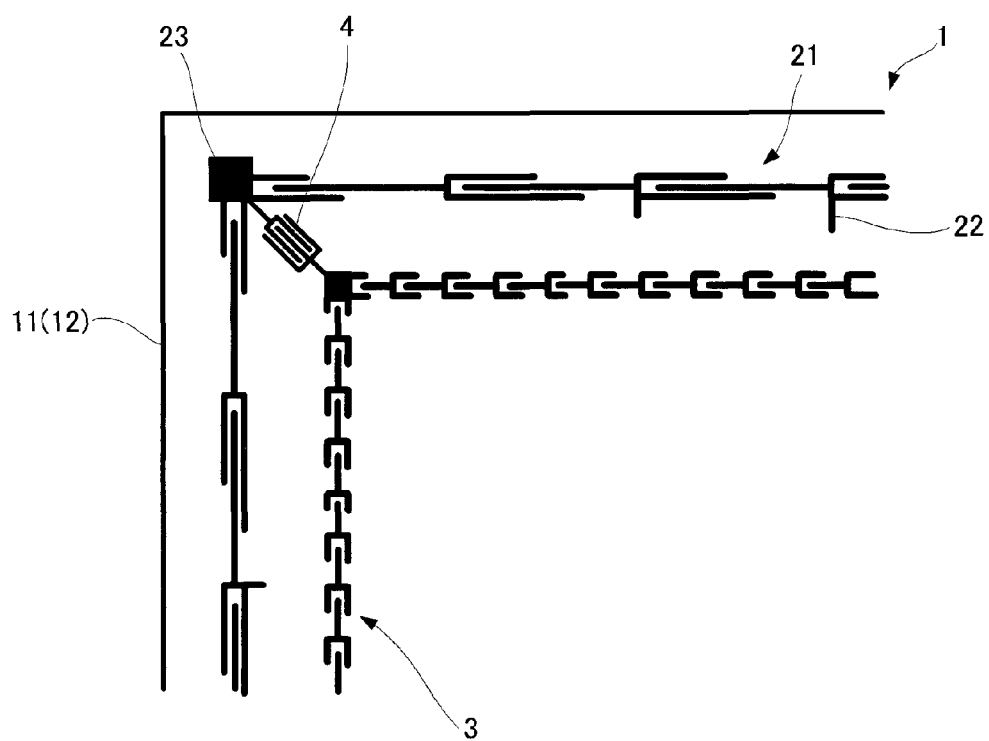
FIG. 12 is an enlarged plan view showing a main part according to the variant of the touch panel illustrated in FIG. 1.

Moreover, as shown in FIG. 12, it is also possible to employ such a structure as to further include a current circuit 4 for an inner electrode portion which connects a corner part of the frame-shaped electrode portion 21 to a corner part of the frame-shaped inner electrode portion 3. It is possible to form the current circuit 4 for the inner electrode portion through coating with a conductive paste such as a silver paste by a printing process, for example, screen printing, ink jet printing, photolithography, or the like. By including the current circuit 4 for the inner electrode portion, it is possible to further relieve the distortion of the electric potential distribution in the corner part of the inner electrode portion 3. Thus, it is possible to form the horizontal and vertical electric potential distributions, thereby obtaining the touch panel 1 with high precision. As a specific structure, for example, it is preferable to set a resistance value of the current circuit 4 for the inner electrode portion in such a manner that a voltage generated between the corner part of the frame-shaped electrode portion 21 and the corner part of the inner electrode portion 3 is equal to a voltage generated between central positions of a side of the frame-shaped electrode portion 21 and a side of the inner electrode portion 3 which are parallel with each other.

Figure 13:
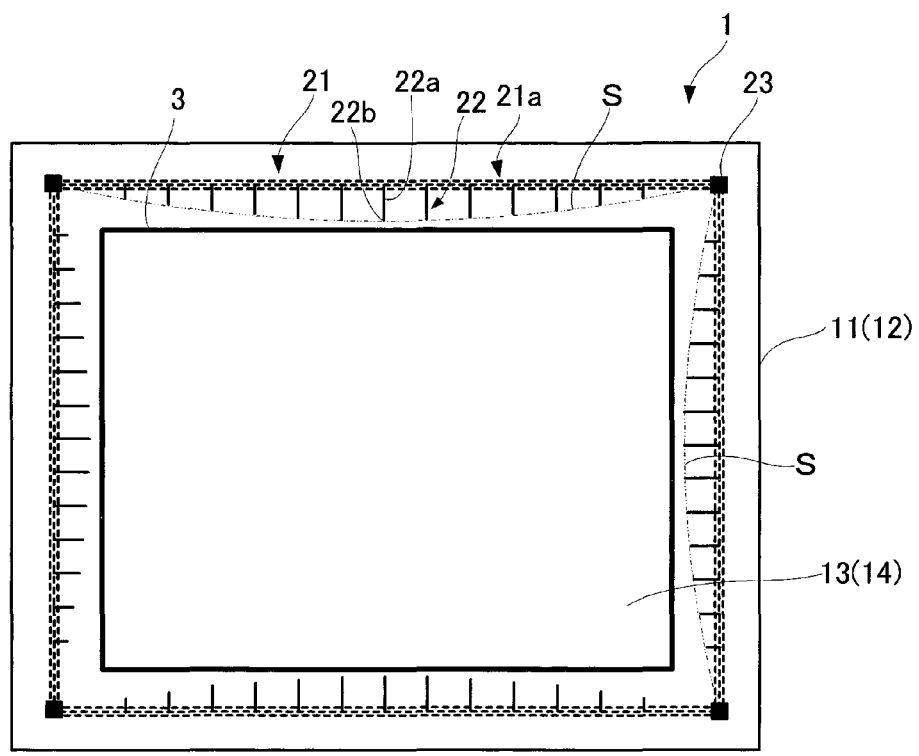
FIG. 13 is a plan view showing a schematic structure according to the variant of the touch panel illustrated in FIG. 1.

Although each side of the frame-shaped inner electrode portion 3 is formed in the broken line pattern divided into a plurality of parts through the gaps in the above embodiment, the present invention is not particularly limited to such a structure. For example, as shown in FIG. 13, it is also possible to form each side of the inner electrode portion 3 to take a shape of a continuous line pattern in which the gap is not provided.

In the above embodiment, the description has been given to the structure in which the touch panel 1 of the resistive type is employed and the frame-shaped electrode portion 21 is provided thereon as the specific structure of the touch panel 1. However, for example, the frame-shaped electrode portion 21 may be applied to an electrostatic capacitance type touch panel. In this case, it is preferable to employ a structure in which the upper substrate 11 in FIG. 3 is not provided but a protective film for protecting the resistive layer 14 formed on the substrate 12 is disposed.

DESCRIPTION OF REFERENCE SIGNS

1 touch panel
11, 12 substrate
13, 14 resistive layer
21 frame-shaped electrode portion
22 electric potential correcting electrode portion
22*a* base end
22*b* tip portion
23 feeding terminal
24 gap
25 split electrode
25*a* first split electrode
25*b* second split electrode
26 coupling conductive portion
3 inner electrode portion

The invention claimed is:

1. A touch panel comprising:
a resistive layer formed on one of surfaces of a substrate; and
a frame-shaped electrode portion provided along four sides of the resistive layer, wherein
each side of the frame-shaped electrode portion is constituted in a broken line pattern having a first split electrode disposed on both ends of each side of the frame-shaped electrode portion respectively and a plurality of second split electrodes disposed between the first split electrodes,
second resistance values between the second split electrodes are set to be equal to each other, and
a first resistance value between the first split electrode and the second split electrode which is adjacent to the first split electrode is different from the second resistance value.

2. The touch panel according to claim 1, wherein a frame-shaped non-touch area which is adjacent to the frame-shaped electrode portion and a touch area disposed on an inside of the non-touch area are provided at an inside of a region surrounded by the frame-shaped electrode portion, and L, L_bow, R_s, R_i and N satisfy a relationship of the following Formula:

$$R\_i \times N/[R\_i \times (N-1) + 2 \times R\_s] \leq (L - 2 \times L\_\text{bow})/L,\quad [\text{Formula}]$$

in which a distance between two sides which are opposed to each other in the frame-shaped electrode portion is represented by L (mm), a distance between each of the two sides and each boundary of a non-touch area which is adjacent to the two sides respectively and the touch area in the non-touch area is represented by L_bow (mm), each of the first resistance values in two other sides to be connected to the two sides is represented by R_s (Ω), each of the second resistance values in the two other sides is represented by R_i (Ω), and the number of the second split electrodes in the two other sides is represented by N.

3. The touch panel according to claim 1, further comprising a plurality of electric potential correcting electrode portions connected to the respective sides of the frame-shaped electrode portion and extended toward an inside of the substrate from the frame-shaped electrode portion, the electric potential correcting electrode portions to be connected to the respective sides of the frame-shaped electrode portion being formed in such a manner that a segment connecting respective tip portions draws a curved line taking a convex shape toward the inside of the substrate in a central part.

4. The touch panel according to claim 3, further comprising a frame-shaped inner electrode portion disposed on the inside of the region surrounded by the frame-shaped electrode portion and having each side which is almost parallel with the side of the frame-shaped electrode portion, a sheet resistance converted value of a resistance value between both ends of the side of the inner electrode portion being set to be smaller than a sheet resistance value of the resistive layer.

5. The touch panel according to claim 4, wherein the inner electrode portion is formed in a broken line pattern.

6. The touch panel according to claim 5, wherein a pitch of the broken line pattern of the inner electrode portion is set to be smaller than a pitch of the broken line pattern of the frame-shaped electrode portion.

7. The touch panel according to claim 6, further comprising a current circuit for an inner electrode portion connecting a corner part of the frame-shaped electrode portion to a corner part of the inner electrode portion.

8. The touch panel according to claim 7, wherein the sheet resistance converted value of the resistance value between the both ends of the side of the inner electrode portion is ⅕ to ⅟₅₀ of the sheet resistance value of the resistive layer.

* * * * *